(12) United States Patent
Oyu et al.

(10) Patent No.: US 7,666,761 B2
(45) Date of Patent: Feb. 23, 2010

(54) SEMICONDUCTOR DEVICE AND MANUFACTURING METHOD THEREOF

(75) Inventors: Kiyonori Oyu, Tokyo (JP); Kensuke Okonogi, Tokyo (JP); Hirotaka Kobayashi, Tokyo (JP); Koji Hamada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 139 days.

(21) Appl. No.: 11/680,814

(22) Filed: Mar. 1, 2007

(65) Prior Publication Data

US 2007/0158784 A1    Jul. 12, 2007

Related U.S. Application Data

(62) Division of application No. 11/089,461, filed on Mar. 25, 2005, now abandoned.

(30) Foreign Application Priority Data

Mar. 25, 2004    (JP) .............................. 2004-88308

(51) Int. Cl.
*H01L 21/322* (2006.01)
(52) U.S. Cl. .............................. 438/473; 257/E21.317
(58) Field of Classification Search ................. 438/143, 438/402, 471, 473, 476; 257/E21.317
See application file for complete search history.

(56) References Cited

U.S. PATENT DOCUMENTS

| 4,131,487 | A |   | 12/1978 | Pearce et al. |         |
|-----------|---|---|---------|---------------|---------|
| 4,782,029 | A | * | 11/1988 | Takemura et al. | 438/472 |
| 5,162,241 | A | * | 11/1992 | Mori et al.   | 438/402 |
| 5,223,734 | A | * | 6/1993  | Lowrey et al. | 257/401 |
| 5,757,063 | A | * | 5/1998  | Tomita et al. | 257/610 |
| 6,225,703 | B1| * | 5/2001  | Umehara et al.| 257/787 |
| 6,376,335 | B1|   | 4/2002  | Zhang et al.  |         |

FOREIGN PATENT DOCUMENTS

| DE | 43 29 837 A1 | 3/1995 |
| DE | 199 50 563 A1 | 5/2001 |
| JP | 57-097630 | 6/1982 |
| JP | 58-97836 | 6/1983 |
| JP | 63211635 | 9/1988 |
| JP | 64-67922 | 3/1989 |
| JP | 5-152306 | 6/1993 |
| JP | 2005-166925 | 6/2005 |
| KR | 2001-0109679 | 12/2001 |

OTHER PUBLICATIONS

German Office Action dated Aug. 21, 2006.
English translation of German Office Action.

(Continued)

*Primary Examiner*—Minh-Loan T Tran
*Assistant Examiner*—W. Wendy Kuo
(74) *Attorney, Agent, or Firm*—Whitham Curtis Christofferson & Cook, PC

(57) ABSTRACT

In manufacturing a semiconductor device, the first gettering layer is formed on the backside of a wafer, and the second gettering layers are then formed on the backside and side surfaces of a chip, allowing these gettering layers to serve as trapping sites against metallic contamination that generated after backside grinding in assembly processes.

9 Claims, 8 Drawing Sheets

OTHER PUBLICATIONS

Korean Office Action dated Jul. 26, 2006 with English translation of pertinent portions.
Japanese translation of Korean Office Action.
The Office Action issued by the Japanese Patent and Trademark Office on Jun. 25, 2008 in relation to corresponding Japanese application with English language translation pp. 1 to 5.

* cited by examiner

SEMICONDUCTOR DEVICE AND MANUFACTURING METHOD THEREOF

RELATED APPLICATION

This is a divisional application from application Ser. No. 11/089,461 filed Mar. 25, 2005, now abandoned the contents of which is incorporated herein by reference.

This application claims priority to prior application JP 2004-88308, the disclosure of which is incorporated herein by reference.

BACKGROUND OF THE INVENTION

1. Field of the Invention

The present invention relates to a semiconductor device and a manufacturing method thereof and, particularly, to a semiconductor device and a manufacturing method thereof which can prevent characteristic deterioration due to metallic contamination which occurs in a backside grinding process and a package assembly process performed after formation of desired devices, wiring, and insulating film on a main surface of a semiconductor substrate.

2. Description of the Related Art

A conventional semiconductor device, shown in FIG. 2, is fabricated as follows. In accordance with a process flowchart shown in FIG. 1, electronic devices 3, wiring 4, an interlayer insulating film 5, and the like, are formed on a surface of a silicon substrate 1. Thereafter a substrate's backside 6 is ground so that the substrate can have a desired thickness. Subsequently, the substrate is diced into chips and, in a TSOP assembly process, a lead frame with LOC tape and a chip are bonded through the LOC tape. Then, after wire bonding, resin sealing is carried out.

As described in Japanese Patent Application Publication (JP-A) No. H1-67922, in a conventional semiconductor device, desired electronic devices, wiring, an insulating film and the like are formed after a gettering layer for counteracting metallic contamination, which is introduced in formation processes, is formed on a substrate's backside.

A conventional semiconductor device has the following drawbacks. When a backside is ground as shown in FIG. 2, the ground surface receives grinding damages such as dislocations 7 and cracks 8, as shown in FIG. 3, and metallic contamination is also introduced into the areas of grinding damages. Moreover, in the subsequent dicing process, dicing damages, which are similar to grinding damages, are introduced into the side surfaces of chips and metallic contamination is also introduced into the side surfaces of the chips.

In addition, after bonding of a lead frame and chips through the LOC tape, the chips in the above-mentioned state are then exposed to thermal process through baking (30 minutes at 150 degrees centigrade, and 90 minutes at 230 degrees centigrade) as well as resin sealing (several tens of minutes at 180 degrees centigrade). Therefore, the metal introduced during the grinding or dicing process is affected by the thermal process in the assembly processes and the metal attached to the ground surface reaches an electronic device formed on the main surface of the substrate. For example, in the foregoing TSOP assembly process, in the case of resin sealing, thermal process of several ten minutes at 180 degrees centigrade is applied to the chips. Therefore, where metal such as copper or the like is attached to a ground surface, a diffusion length thereof within the substrate (silicon) becomes several 100 μm. In addition, since the thickness of the chip after the backside grinding is also several 100 μm, the metal can easily reach an electronic device formed on the substrate's main surface.

As described above, once a contaminating metal reaches an electronic device on a main surface of a substrate, various problems become apparent. For example, when a contaminating metal reaches the depletion layer of a source/drain junction, it leads to the formation of surface state and thus causes the generation of junction leakage current. Furthermore, if a contaminating metal reaches a gate insulating film, insulating film leakage current increases. Because of such increases in the leakage current, characteristics of an electronic device are deteriorated. The above-mentioned problem has been increasingly serious particularly in recent years as a multi-chip package, wherein chips with a reduced thickness of about 100 μm are stacked, has been commercialized.

A backside gettering layer formed in a conventional semiconductor device described in Japanese Patent Application Publication No. H1-67922 has a gettering effect against metallic contamination introduced in formation processes of electronic devices and the like. However, since a backside of a substrate in a wafer state is ground to have a desired thickness before being assembled onto a package assembly, the gettering layer is removed by the grinding. Hence, the gettering layer loses its gettering capability against metallic contamination introduced in the backside grinding and package assembly. Because the backside gettering layer is removed by backside grinding, it is not feasible to prevent characteristic deterioration caused by metallic contamination introduced after the backside grinding.

Nevertheless, since the backside receives grinding damages caused by the backside grinding, which produces gettering capability remains, albeit only slightly. Yet, the gettering capability produced by a grinding damage layer is not sufficient and is not able to suppress the above-described characteristic deterioration. Particularly, in recent years, adverse effects of metal contamination from a backside towards a main surface have been significant more than ever since a chip thickness in a multi chip package and the like after backside grinding has been reduced to around 100 μm.

SUMMARY OF THE INVENTION

An object of the present invention is to resolve these problems and provide a semiconductor device and a manufacturing method thereof which can prevent characteristic deterioration due to metallic contamination which occurs during backside grinding, dicing and package assembly.

In the present invention, a thermal treatment is applied to a backside grinding damage layer or a dicing damage layer in an atmosphere containing an impurity, thus forming a gettering layer to capture a contaminating metal. Furthermore, by using a material containing less contaminating metal and cleaning a contaminating metal away, concentration of the contaminating metal is reduced, thus obtaining a semiconductor device manufacturing method and a semiconductor device which can prevent characteristic deterioration due to metallic contamination which occurs in backside grinding and package assembly.

DESCRIPTION OF THE PREFERRED EMBODIMENTS

A semiconductor device and a manufacturing method thereof are described below in detail with reference to the drawings.

Embodiment 1

Embodiments of the present invention are detailed using TSOP assembly of a semiconductor device shown in FIGS. 4 to 11 as examples. An assembly flowchart of the present invention has additional processes of laser beam irradiation for the backside of a wafer and pressing a hot material to a chip's backside.

Figure 1:
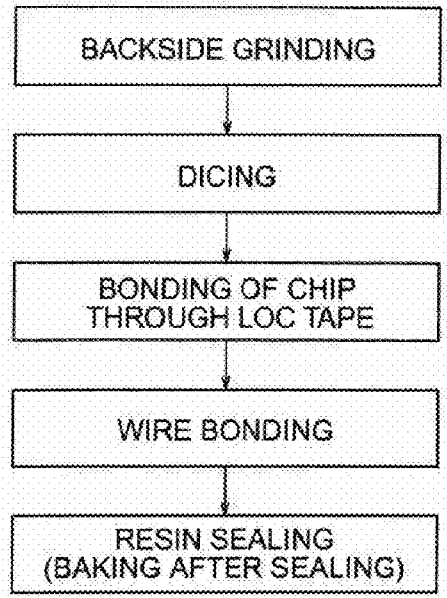
FIG. 1 is an assembly process flowchart of conventional device.
Figure 2:
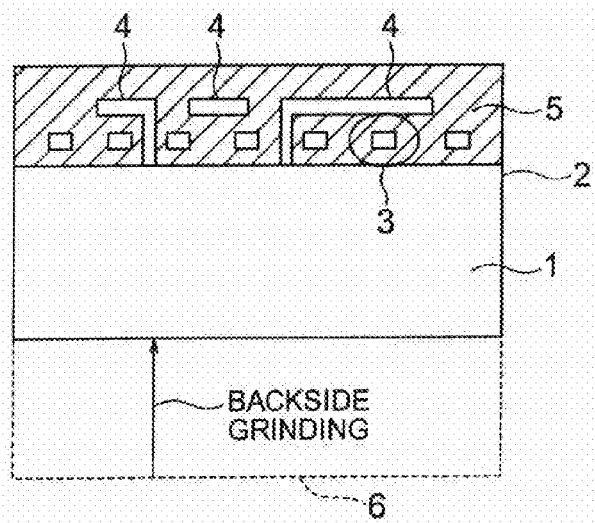
FIG. 2 is a view showing an image of backside grinding.
Figure 3:
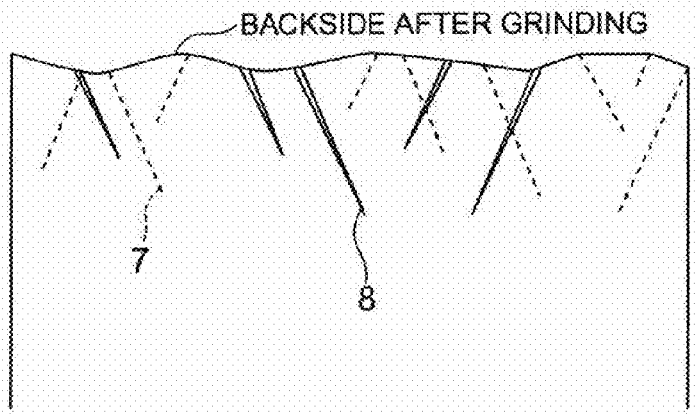
FIG. 3 is a view showing an image of a ground surface.
Figure 4:
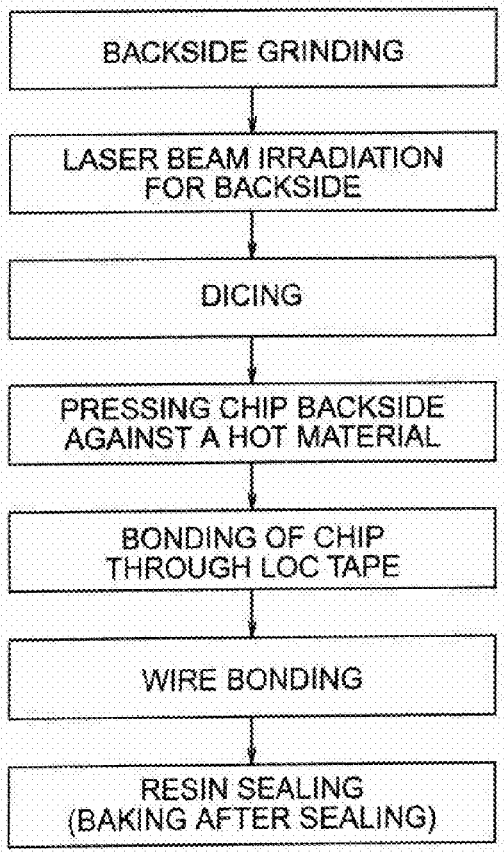
FIG. 4 is an assembly process flowchart in embodiment 1.

First of all, as shown in the assembly flowchart of FIG. 4, the surface of a silicon wafer, on which semiconductor devices have been fabricated in a normal method, was protected with a protection sheet, and the backside of the wafer was ground. During this grinding process, the first rough grinding was performed at roughness of about #300 until the wafer thickness became about between 750 μm and 300 μm, and finishing grinding was then performed at roughness of about #2000 until the wafer thickness became 280 μm. Thereafter, the protection sheet on the surface is removed and washed with water in order to remove dusts attached to the grinded surface during the grinding.

Figure 5:
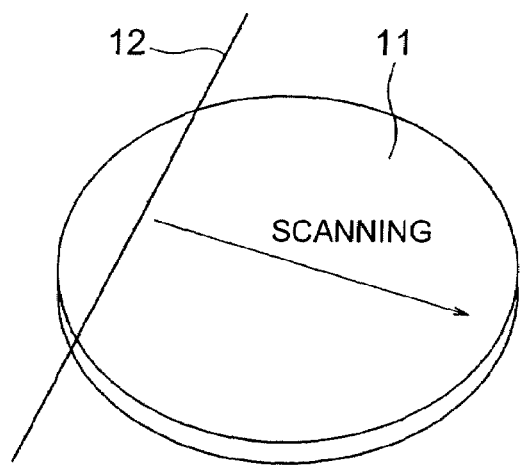
FIG. 5 is a view showing laser beam irradiation in embodiment 1.
Figure 6:
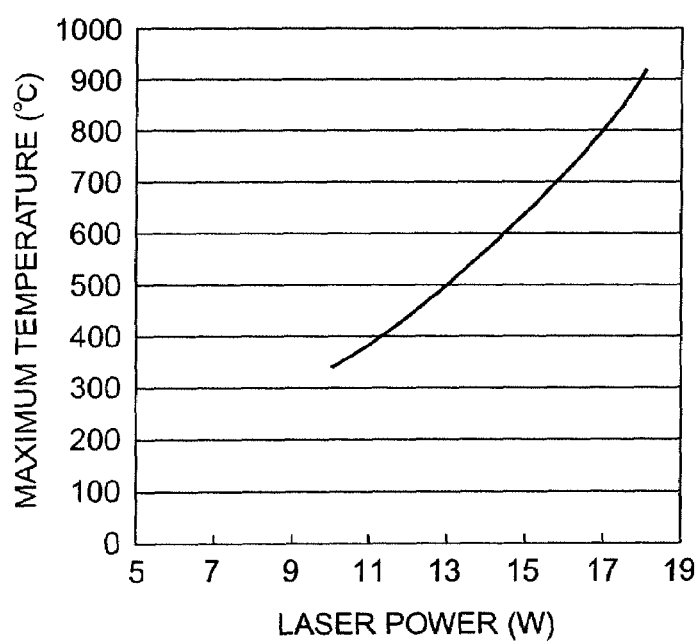
FIG. 6 is a graph showing laser power dependence of maximum backside temperature in embodiment 1.

As shown in FIG. 5, in order to form a gettering layer, the wafer's backside 11 is irradiated with a laser beam 12 while the backside 11 is exposed to an atmosphere containing oxygen. The laser beam was a linear beam with a beam diameter of 0.2 mm and laser power ranging from 9 W to 18 W. Irradiation of this beam is carried out at a scanning rate of 1 mm/s. At this time, as shown in FIG. 6, maximum temperature of the backside can be controlled by power and is preferably between 300 degrees centigrade for about 10 seconds and 900 degrees centigrade for about 0.01 seconds. The atmosphere containing oxygen may be an atmosphere containing oxygen only, or air, as long as it contains at least 1% of oxygen so that oxygen is supplied to the substrate.

Figure 8:
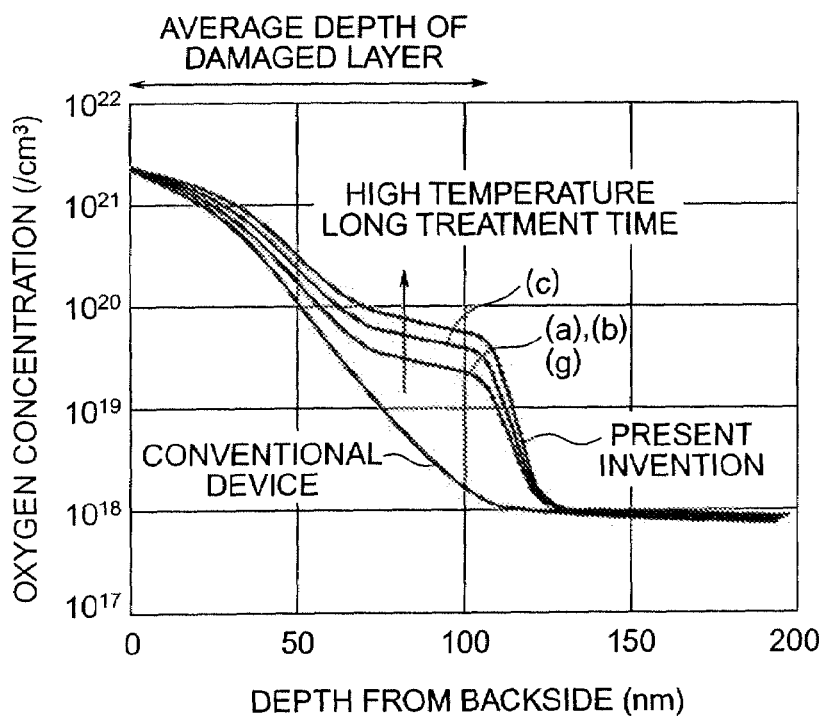
FIG. 8 is a graph showing distribution of oxygen concentration in embodiment 1.

In this embodiment, maximum temperature is set to 800 degrees centigrade. Effective thermal treatment time is 0.1 seconds. By this thermal treatment, sufficient oxygen was supplied to dislocations and scratches (cracks) generated during backside grinding, thus increasing gettering capability. As shown in FIG. 8, an oxygen concentration of conventional device without thermal treatment shows a linear decline from $2\times10^{21}/cm^3$ near the backside to $2\times10^{18}/cm^3$ at an average depth of a grinding damaged layer.

An oxygen concentration of the present invention was $2\times10^{21}/cm^3$ near the backside, but a high concentration area between $10^{20}/cm^3$ and $10^{21}/cm^3$ had oxygen distribution similar to that of conventional device but oxygen diffusion is slightly more advanced. The next concentration area has an impurity-diffused region between $10^{19}$ and $10^{20}/cm^3$, and this area has a very moderate gradient because of the thermal treatment of the present invention. In an area deeper than this, the concentration suddenly drops to an original oxygen concentration of a silicon substrate.

The concentration distribution in the present invention was the one obtained by adding the distribution of further introduced impurity to the conventional concentration distribution. The impurity diffused region having a very gentle concentration gradient is where impurity is introduced by thermal treatment for impurity introduction and is called a gettering impurity introduced region. In this embodiment, the concentration in the gettering impurity introduced region was $2\times10^{19}/cm^3$ or higher, about 10 times that of conventional device. The higher treatment temperature or the longer treatment time, the higher the concentration becomes. The region between the backside and an area having a concentration of $2\times10^{19}/cm^3$ or higher, and the gettering impurity introduced region acts as a main gettering layer.

On the damaged layer of the ground backside, an impurity is easily diffused along dislocations, defects, and cracks and the concentration thereof will become $2\times10^{19}/cm^3$, equal to or higher than the solid solubility. However, in a normal silicon substrate region deeper than the grinding damaged layer, it is impossible for an impurity to diffuse with a concentration equal to or higher than the solid solubility, and the concentration thus drops sharply to an original oxygen concentration of the silicon substrate. Therefore, it can be said that the depth of a gettering layer and an average depth of a grinding damaged layer formed during backside grinding are virtually the same. Moreover, a gettering layer has an oxygen concentration equal to or higher than the maximum solid solubility (for example, $2\times10^{18}/cm^3$ for oxygen), and oxygen is present in a form of an oxide film, an incomplete oxide film (Si—O) or oxygen precipitation, serving as a gettering center against contamination metal.

Therefore, in comparison with conventional device, this example had a much higher concentration of oxygen because of an addition of a gettering impurity introduced region, and the damaged layer generates crystal defects, dislocations and stacking faults, which then become a gettering layer where sufficient trapping sites for fixing metallic contamination were formed. The grinding damaged layer means a region where defects and scratches (cracks) are generated. The average depth of the grinding damaged layer means a depth of a region where at least any of the defects and scratches (cracks) are continuously generated and the defects and damages (cracks) adjoin each other within a distance equivalent to a size of each of defects and scratches (cracks).

Note that, in the grinding damaged layer, the concentration distribution becomes the highest near the backside and gets gradually lower in a deeper area from the backside (an area closer to the electronic device side on the surface). Normally, the concentration distribution can be measured by the secondary-ion mass spectrometry. However, with this method, analysis results will be abnormal for an area between the backside and the depth of 10 nm as such area is effected by interfaces. Therefore, the concentration of the above grinding damaged layer near the backside is indicated as a concentration analyzed at a depth of 10 nm or more from the backside where no effects were imposed by the interfaces. Further, the concentration within the grinding damaged layer indicates a concentration of $2 \times 10^{18}/cm^3$ or higher, the maximum solid solubility of oxygen within silicon crystal.

Figure 9:
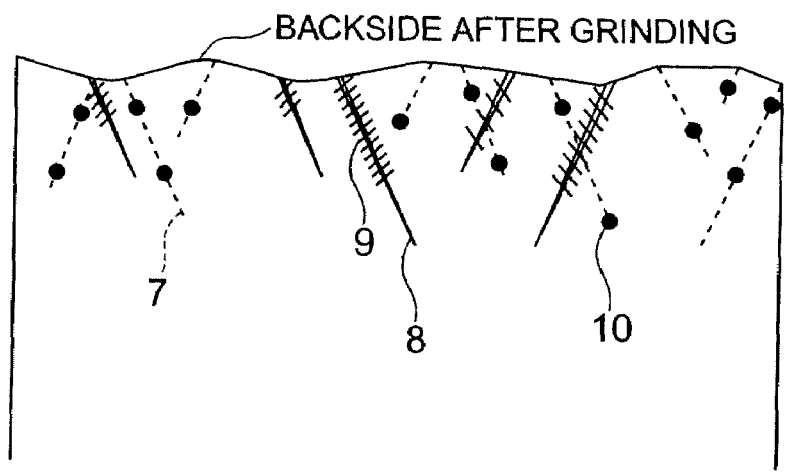
FIG. 9 is a view showing an image of a grinded surface after thermal treatment in embodiment 1.

FIG. 9 shows an image of a backside state after the thermal treatment. By conducting the thermal treatment of the grinding damaged layer in an atmosphere containing oxygen, interfaces of the scratches 8 in the damaged layer are oxidized, forming oxide films 9, and oxygen to be precipitated 10 and crystal defects such as stacking faults were allowed to occur in dislocations 7 on the damaged layer. The oxide film 9, oxygen precipitation 10 and crystal defects fixed contaminating metals and acted as trapping sites of the contaminating metals. In the grinding damaged layer, oxygen soaks through the damaged layer along the defects and scratches (cracks). Therefore, the depth of the damaged layer and a depth of a region where highly concentrated oxygen is distributed are virtually the same. Therefore, the average depth of the grinding damaged layer and the depth of the gettering layer are the same.

Figure 7:
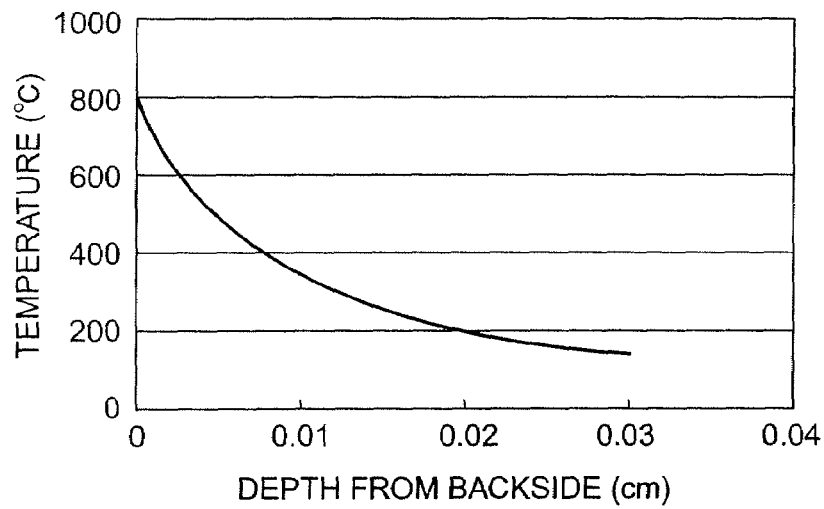
FIG. 7 is a graph showing depth dependence of substrate temperature in embodiment 1.

A temperature distribution from the backside is as shown in FIG. 7, and the temperature of the substrate main surface was about 150 degrees centigrade. Since the substrate main surface received a low temperature treatment only, there is no characteristic change of electronic devices at all. However, attention needs to be paid to the fact that thermal treatment for several tens of seconds at 300 degrees centigrade or over may cause desorption of hydrogen which terminates defects. As the hydrogen desorption develops, joint leakage current may increase and a threshold value of transistors may change, resulting in characteristic changes. Therefore, it is necessary to select irradiation conditions of the laser beam which maintains the temperature of substrate surface at 300 degrees centigrade or lower.

Next, the wafer is diced into chips in the state that a protection sheet for dicing was adhered to the backside of the wafer. At this time, temperature of adhesion was set at 150 degrees centigrade. Side surfaces of diced chips were mechanically damaged, which means that dicing damages, similar to grinding damages on the backsides of the chips, were formed on side surfaces of the chips.

Figure 10:
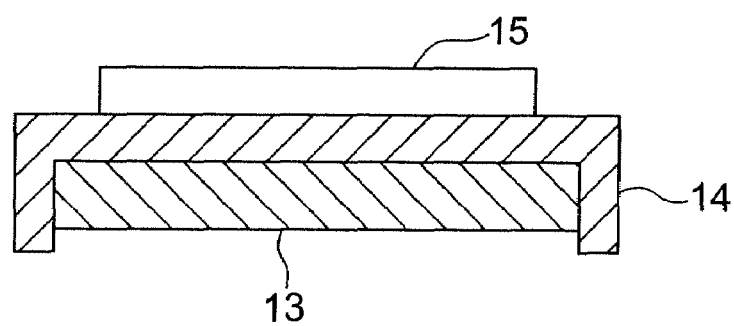
FIG. 10 is a view showing a method of heating a backside of a chip in embodiment 1.

After completion of dicing, a second gettering layer was formed. As shown in FIG. 10, thermal treatment of the chips was carried out at high temperature of 300 degrees centigrade for about 10 seconds and 900 degrees centigrade for about 0.01 seconds in an oxygen-containing atmosphere. In this embodiment, the backside of the chip 15 was pressed for 0.5 seconds against quartz 14 coating a piece of metal 13 heated to 600 degrees centigrade. This allows gettering capability on the backside to further enhance and, at the same time, gettering layers were formed on the damaged layers on diced surfaces on the side of the chips as they were provided with oxygen and subjected to the thermal treatment. By forming gettering layers on chips after dicing, the surfaces of the chips are protected by passivation layers and both backsides and side surfaces of the chips are provided with gettering layers and thus gettering capabilities against metallic contamination, preventing characteristic deterioration.

At this time, the oxygen concentration of the backside damaged layer near the back side was $2 \times 10^{21}/cm^3$, and the same at the average depth of the backside damaged layer was $4 \times 10^{19}/cm^3$, about 20 times the concentration of $2 \times 10^{18}/cm^3$ without sufficient oxygen supply. The oxygen distribution on the side surface of the chip is $2 \times 10^{21}/cm^3$ near the interface and the same at the average depth of the dicing damaged layer was $2 \times 10^{19}/cm^3$.

As shown in FIG. 8, as for the average depth of the grinding damaged layer, the concentration of the gettering layer on the backside was doubled to $4 \times 10^{19}/cm^3$ as the concentration of the second gettering layer is superimposed on that of the first gettering layer, whereas the concentration of the gettering layer on the side surface of the chip was $2 \times 10^{19}/cm^3$, which was the concentration of the second gettering layer only. After the first gettering, the concentration becomes $2 \times 10^{19}/cm^3$ (see FIGS. 8(a), 8(b) and 8(g)), and the concentration becomes higher after the second gettering to $4 \times 1019/cm3$ (see FIG. 8(c)). In addition, higher treatment temperature and longer treatment time provides higher concentration. The concentration near the backside was almost consistent due to the foregoing problem of measurement error. As described above, it is evident that higher treatment temperature and higher treatment time can form a gettering layer with high concentration. The dicing damaged layer on the side surface showed a concentration distribution curve similar to that of the grinding damaged layer. Therefore, it can also be said that the depth of the gettering layer and the average depth of the dicing damaged layer produced during dicing are virtually the same.

Moreover, since gettering layers are formed on both backsides and side surfaces of chips after dicing, laser beam irradiation for forming the first gettering layer can be omitted, or only the first gettering layer can be formed. Formation processes of the first gettering layer and the second gettering layer can be regarded as independent processes. Therefore, it is possible to provide only the first gettering layer, only the second gettering layer or both first and second gettering layers.

Thereafter, a chip was adhered to a lead frame with LOC tape and then baked for 30 minutes at 150 degrees centigrade and 90 minutes at 230 degrees centigrade. After the baking, wires were bonded at 150 degrees centigrade and the chip was put into a metal cavity kept at high temperature of 180 degrees centigrade. Subsequently, resin was poured into the cavity.

Because resin used here is thermosetting resin, temperature of 180 degrees centigrade was high enough to fully solidify the resin. After the resin is solidified, the assembly processes of a semiconductor device are completed.

Figure 11:
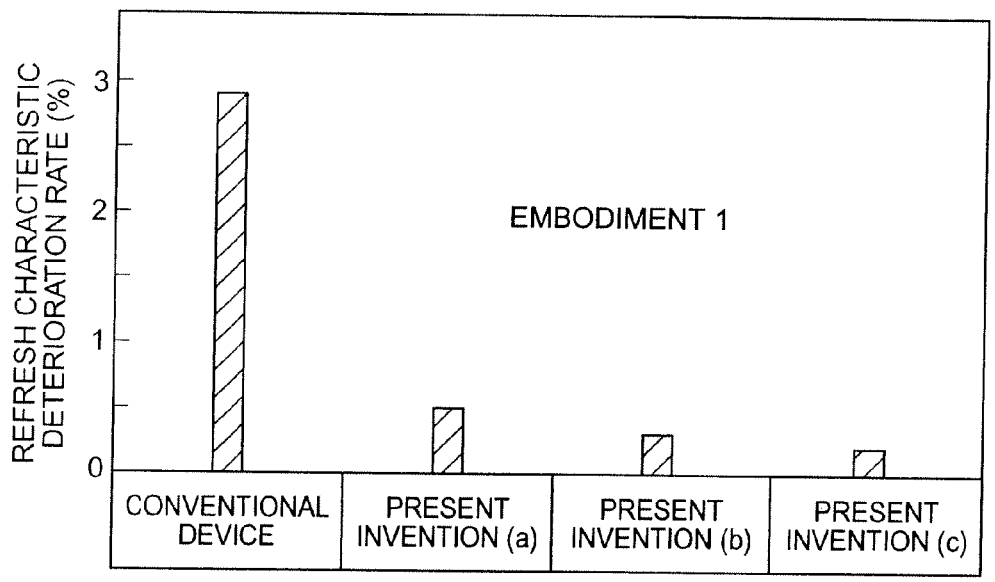
FIG. 11 is a graph showing characteristic deterioration rates in embodiment 1.

FIG. 11 shows refresh characteristic deterioration rates of DRAMs as an example of semiconductor devices having the gettering layers in the present invention. FIG. 11 shows a chip as a conventional device having no gettering layer, and (a) a result of the case where laser beam was irradiated as the method of making the first gettering layer, as the present invention, and (b) a result of the case where the backside of the chip was pressed against a hot material as the method of making the second gettering layer, as the present invention, and (c) a result of the case where laser beam was irradiated and the chip was pressed against a hot material as the method of making both the first and second gettering layers, as the present invention, respectively. The deterioration rate of conventional device was about 3% and those of the present invention were reduced to 0.5% or lower. It is the most effective case to carry out both laser beam irradiation and pressing of the chip against a hot material, and, in this case, the deterioration rate thereof was reduced to as low as 0.2%. The second most effective case was where the chip was pressed against a hot material. In this case, the deterioration rate thereof was 0.3%. In the case of laser irradiation, the deterioration rate was 0.5%. Accordingly, by forming a gettering layer serving as a trapping site of contaminating metals, it becomes possible to prevent characteristic deterioration due to metallic contamination which was occurred during backside grinding and package assembly.

In this embodiment, oxygen was used as an impurity which forms a gettering layer. However, the impurity may be any of oxygen, argon, carbon, nitrogen, boron, phosphorous, arsenic, antimony and the like or a chemical compound thereof, as long as it generates dislocations or stacking faults in the crystal of a grinding damaged layer by applying thermal treatment. However, oxygen, argon, carbon, and nitrogen are preferred as they are the most easy-to-use for an apparatus for forming a gettering layer.

In this embodiment, after backside grinding, the first gettering layer was formed in the backside of a wafer, and the second gettering layers were formed on both backside and side surfaces of each chip, allowing the gettering layers to serve as trapping sites of metallic contamination after the backside grinding process in the assembly flowchart. As a result, even where metallic contamination occurs during backside grinding and package assembly, the above-mentioned trapping sites of metallic contamination, formed by thermal process in the assembly processes, does not allow the metal contamination to reach electronic devices formed in the main surface of the substrate. Therefore, it becomes possible to prevent characteristic deterioration due to metallic contamination which is introduced in backside grinding and package assembly.

Embodiment 2

Figure 12:
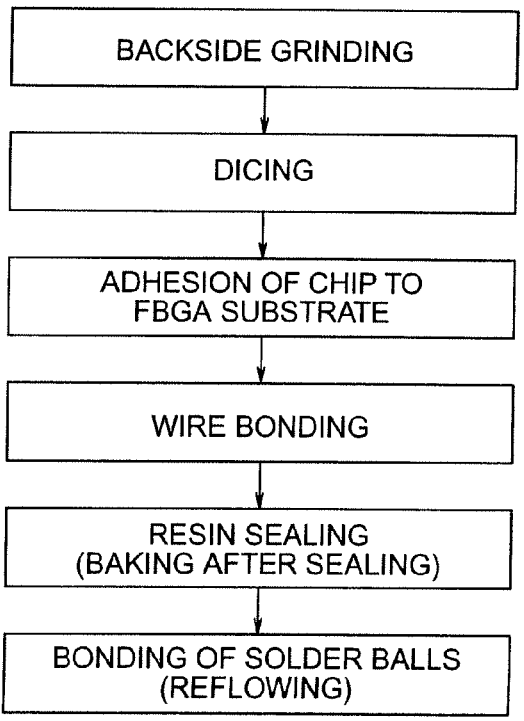
FIG. 12 is an assembly process flowchart in embodiment 2.
Figure 13:
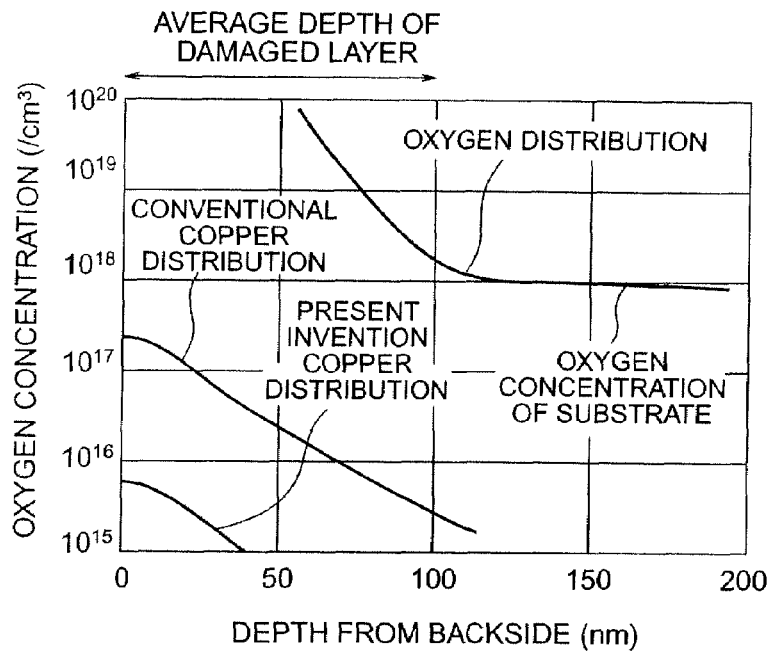
FIG. 13 is a graph showing distribution of a copper concentration in embodiment 2.
Figure 14:
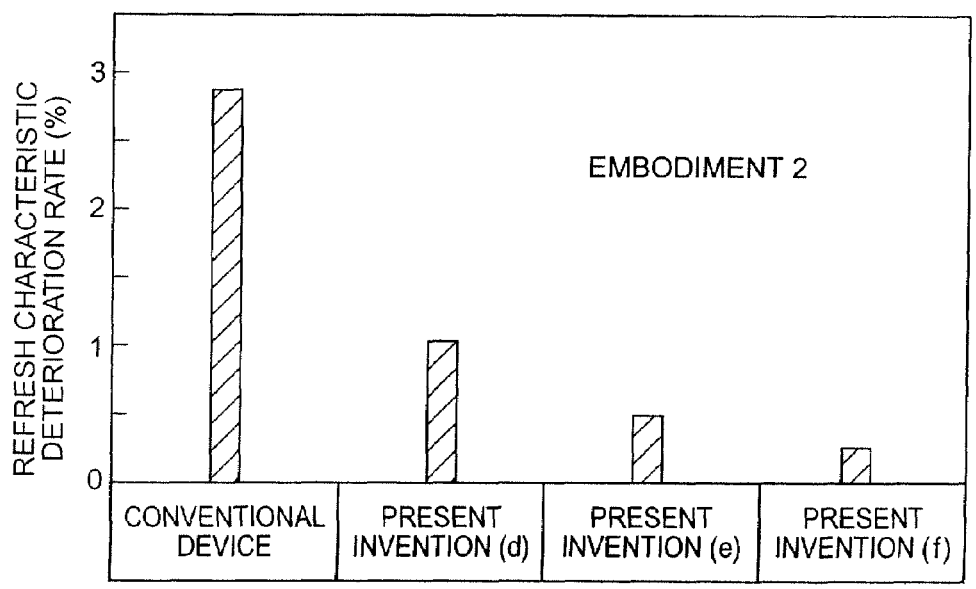
FIG. 14 is a graph showing characteristic deterioration rates in embodiment 2.

Next, embodiment 2 in the present invention is detailed using FBGA assembly of a semiconductor device shown in FIGS. 12 to 14 as an example.

First of all, as shown in the assembly flowchart of FIG. 12, the surface of a silicon wafer on which semiconductor devices are fabricated in a normal method, was protected by a protection sheet, and the backside of the wafer was ground in that state. During this grinding process, the first rough grinding is performed at roughness of about #300 until the thickness of the wafer becomes about 750 μm and 200 μm, and finishing grinding was then performed at roughness of about #2000 until the thickness of the wafer becomes 180 μm. Here, a comparison is made among a case of grinding using a normal backside grinder, and the following cases in the present invention:

a case (d) where the backside is ground with copper-contamination-free transfer system, grinding blade and grinding water;

a case (e) where the final grinding in the grinding process was carried out using a copper-free adhesive for bonding a grinding blade and a grinding wheel; and a case (f) where copper on a ground surface was cleaned before the respective grinding processes and a copper-free adhesive was used for bonding a grinding blade and a grinding wheel.

Since no consideration had been given to the issue of copper contamination, conventional grinding process is carried out. So the grinding process in this invention is carried out in a state where a transfer system, a grinding blade and grinding water are all copper-free. An adhesive used for bonding a grinding blade and a grinding wheel usually contains several 10% of copper to enhance its adhesive force, and a grinding damaged layer after finishing grinding contains copper of about $1\times10^{12}/cm^3$. As shown in FIG. 13, a copper concentration in conventional process was as high as about $1\times10^{17}/cm^3$ near the surface of a grinding damaged layer. Meanwhile, in the case where a copper-free adhesive (with copper concentration of 1% or lower) is used, a grinding damaged layer contains copper of less than $1\times10^{11}/cm^3$, and the concentration of copper near the surface is $1\times10^{16}/cm^3$ or lower with some variations depending on each grinding. In addition, since copper is introduced into a grinding damaged layer while damages were formed during the grinding process, the copper contamination may be generated through a transfer system or the like even if the above-mentioned adhesive contains no copper. Hence, if copper contamination is cleaned before grinding, it becomes more effective to use a copper-free adhesive. Here, copper contamination was cleaned with pure water cleaning only but may be cleaned with diluted nitric acid. Note that the grinding damaged layer contained high concentration of oxygen ($1\times10^{18}/cm^3$ or higher).

Next, after the wafer was diced into chips, each chip was adhered to a FBGA substrate at 180 degrees centigrade through an adhesive tape. Thereafter, wire bonding was carried out at 180 degrees centigrade and the chips were sealed with resin, and baking is carried out 7 hours at 180 degrees centigrade. Thermal process is applied to the chips many times at 180 degrees centigrade, and therefore, defects and scratches (cracks) are oxidized by oxygen on a grinding damaged layer, providing the chips with gettering effect against metallic contamination. At the same time, non-gettered contaminating metal is diffused towards the main surface of the substrate. Since copper is particularly quickly diffused, copper reaches the main surface first. If copper contained in a grinding damaged layer is maintained at $1\times10^{16}/cm^3$ or lower as in the present invention, copper rarely reaches the substrate's main surface since most copper is gettered by the oxidized defects and scratches (cracks). Therefore, last solder balls were attached by reflowing at 250 degrees centigrade.

FIG. 14 shows refresh characteristic deterioration rates of DRAMs as an example of semiconductor devices wherein copper concentrations of the damaged layers are reduced, in the present invention. Where a conventional grinding process was used, deterioration rate was about 3%. Meanwhile, in a case (d) in the present invention where backside grinding process was carried out with copper-contamination-free transfer system, grinding blade, grinding water and the like, a deterioration rate was reduced as low as 1%. Furthermore, in a case (e) in the present invention where a grinding blade and a grinding wheel used for finish grinding in grinding processes was bonded with a copper-free adhesive, a deterioration rate was reduced as low as 0.5%. In a case (f) in the present invention where copper on a ground surface was cleaned (with water or both diluted nitric acid and water) before the respective grinding processes, and a copper-free adhesive was used for bonding a grinding blade and a grinding wheel, the deterioration rate was reduced as low as about 0.3%. It is obvious that a combination of this embodiment and foregoing embodiment 1 reduces the deterioration rate further.

Embodiment 2 shows that special thermal treatment is not applied to a grinding damaged layer by using no contaminating metal during assembly processes and removing the contaminating metal by cleaning in order to prevent characteristic deterioration of a semiconductor device. In the present invention, copper used in an adhesive for bonding a grinding blade and a grinding wheel was described as a representative of contaminating metals. However, other metals, such as iron, nickel, chromium and the like that are often used in fabrication apparatuses of semiconductor devices, cause characteristic deterioration of semiconductor devices. Therefore, needless to say, the concentration rates of such metals should also be maintained at $1\times10^{16}/cm^3$ or lower.

Embodiment 3

Next, embodiment 3 of the present invention is detailed. In this Example, the gettering layer described in embodiment 1 was formed by a plasma treatment.

Figure 15:
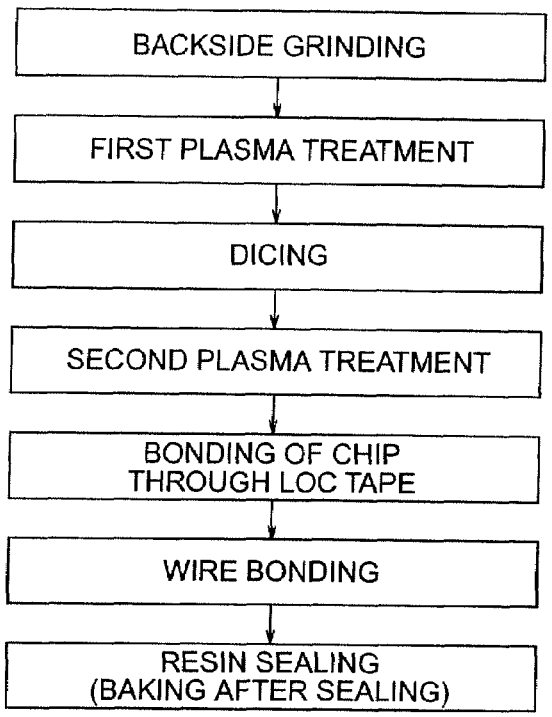
FIG. 15 is an assembly process flowchart of embodiment 3.

In the flowchart of FIG. 15, similarly to embodiment 1, a first gettering layer was formed on the backside of a wafer by a first plasma treatment after backside of the wafer was ground, and then a second gettering layer was formed by a second plasma treatment after the wafer is diced. Both the first and second plasma treatments are carried out in a plasma atmosphere containing an impurity. These plasma treatments were performed, for example, using a plasma device, with plasma power of 2 KW, at substrate temperature of 150 degrees centigrade, using diluent gas containing oxygen as an impurity, at ressure of 1 Torr, and for treatment time of 60 seconds. Processes of backside grinding, dicing, bonding chips to LOC tape, wire bonding, and resin sealing are the same as those of embodiment 1 and descriptions thereof are thus omitted.

In case of the plasma treatment, a gettering layer can be formed even at low temperature such as 150 degrees centigrade as described above. This temperature is even lower than that for an assembly process (baking temperature after bonding of chips and LOC tape is 230 degrees centigrade) and does not cause hydrogen desorption of a passivation film which protects the surface of a semiconductor device. Therefore, this temperature has the advantage which allows to make a plasma treatment time to be carried out for extended time and to obtain a high concentration of introduced impurity. Further, since the treatment temperature is lower than heat-resistance temperature of a protection sheet for dicing, the plasma treatment can be conducted, while using the protection sheet. Therefore, this is advantageous in that freely transferring and handling of wafers in manufacturing processes can be done more freely.

Figure 16:
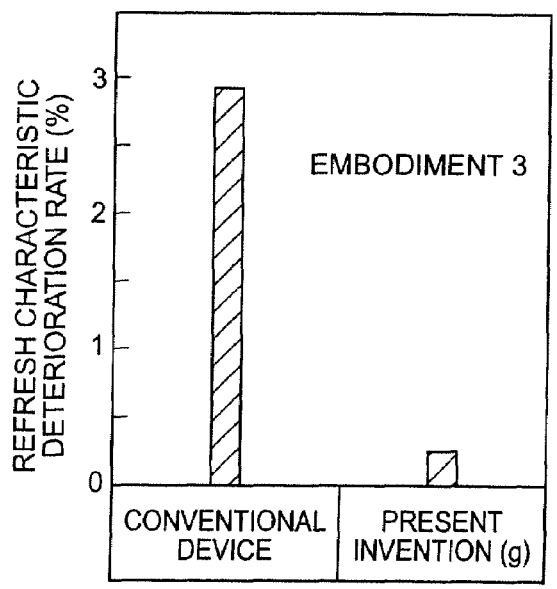
FIG. 16 is a graph showing a characteristic deterioration rate in embodiment 3.

FIG. 16 shows a refresh characteristic deterioration rate of a DRAM which is as a novel semiconductor device in case (g) where only the second gettering layer was formed by the second plasma treatment in the present embodiment. A deterioration rate in conventional device without any gettering layer is not formed was about 3%, whereas the deterioration rate of this embodiment was reduced as low as 0.3%. In addition, oxygen concentration near the backside surface and at an average depth of the grinding damaged layer are $2 \times 10^{21}/\text{cm}^3$ and $2 \times 10^{19}/\text{cm}^3$, respectively, in the same way as the case in embodiment 1 where a chip was pressed against a hot material (see FIG. 8). Formation of the first gettering layer by the first plasma treatment and formation of the second gettering layer by the second plasma treatment were independently processed, respectively. Therefore, it is possible to provide only the first gettering layer, only the second gettering layer, or both of the first and second gettering layers.

The preferred conditions for the plasma treatment are that an impurity should be containing any of oxygen, argon, carbon, boron, phosphorous, arsenic, antimony, or a compound thereof, the substrate temperature should be between 100 and 500 degrees centigrade, the plasma power of between 1 and 5 KW, the pressure of between 1 and 10 Torr, and the treatment time of between 0.1 and 200 seconds. In addition, the substrate temperature within the range of between 100 and 300 degrees centigrade is more preferred since there is less affections of hydrogen desorption at this range of temperature.

Similarly to example 1, after backside grinding, the first gettering layer was formed in the backside of a wafer, and the second gettering layers were formed in both backside and side surfaces of each chip, allowing the gettering layers to serve as trapping sites of metallic contamination after the backside grinding process in the assembly flowchart. As a result, even where metallic contamination was occurred on backside grinding and package assembly, the above-mentioned trapping sites of metallic contamination, formed by thermal loading in the assembly processes, does not allow the metal contamination to reach electronic devices formed in the main surface of the substrate. Therefore, it becomes possible to prevent characteristic deterioration due to metallic contamination which is generated in backside grinding and package assembly.

The present invention is described specifically based on embodiments. However, needless to say, the present invention is not limited to these embodiments and may be modified in varying manners not departing from the gist thereof.

What is claimed is:

1. A manufacturing method of a semiconductor device, comprising:
    a backside grinding step; and
    a first gettering step for forming a first gettering layer on a backside of a wafer which is backside-grinded in the backside grinding step, wherein, in the first gettering step, the first gettering layer is formed by introducing an impurity into the backside of the wafer and the first gettering layer is formed by applying a thermal treatment to the ground backside of the wafer in an atmosphere containing an impurity at backside temperature ranging from 300 to 900 degrees centigrade with treatment time of 0.01 seconds or longer but not exceeding 10 seconds, wherein the semiconductor device, with the first gettering layer, is subjected to resin sealing.

2. A manufacturing method of a semiconductor device, wherein the thermal treatment according to claim 1 is a treatment for irradiating laser beam irradiation to the backside of the chip.

3. A manufacturing method of a semiconductor device, wherein the impurity according to the claim 1 contains any of oxygen, argon, carbon, nitrogen, boron, phosphorous, arsenic, antimony, or a chemical compound thereof.

4. A manufacturing method of a semiconductor device, comprising:
    a backside grinding step;
    a first gettering step for forming a first gettering layer on a backside of a wafer which is backside-grinded in the backside grinding step, wherein, in the first gettering step, the first gettering layer is formed by introducing an impurity into the backside of the wafer;
    a dicing step; and
    a second gettering step for forming second gettering layers on backside and side surface of a diced chip, wherein, in the second gettering step, the second gettering layers are formed by introducing an impurity to the backside and side surface of the chip, wherein the semiconductor device, with the first and second gettering layers, is subjected to resin sealing.

5. A manufacturing method of a semiconductor device wherein, in the second gettering step according to claim 4, the second gettering layers are formed by applying a thermal treatment to the backside and side surface of the chip in an atmosphere containing an impurity at backside temperature ranging from 300 to 900 degrees centigrade with treatment time of 0.01 second or longer but not exceeding 10 seconds.

6. A manufacturing method of a semiconductor device, wherein the thermal treatment according to claim 5 is performed by pressing the backside of the chip against a hot material.

7. A manufacturing method of a semiconductor device, wherein the impurity according to claim 4 contains any of oxygen, argon, carbon, nitrogen, boron, phosphorous, arsenic, antimony, or a chemical compound thereof.

8. A manufacturing method of a semiconductor device, comprising:
- a backside grinding step; and
- a first gettering step for forming a first gettering layer on a backside of a wafer which is backside-grinded in the backside grinding step, wherein, in the first gettering step, the first gettering layer is formed by introducing an impurity into the backside of the wafer, wherein a depth of the first gettering layer and an average depth of a grinding damaged layer caused by the backside grinding step are the same.

9. The manufacturing method according to claim 4, wherein a depth of the first gettering layer and an average depth of a grinding damaged layer caused by the backside grinding step are the same, and wherein a concentration of the first gettering layer due to the second gettering step is doubled and a depth of the second gettering layer and an average depth of a damaged layer caused by the dicing step are the same.

* * * * *